United States Patent
Ebbers et al.

(10) Patent No.: US 7,179,405 B2
(45) Date of Patent: Feb. 20, 2007

(54) NONLINEAR OPTICAL CRYSTAL OPTIMIZED FOR YTTERBIUM LASER HOST WAVELENGTHS

(75) Inventors: Christopher A. Ebbers, Livermore, CA (US); Kathleen I. Schaffers, Pleasanton, CA (US)

(73) Assignee: The Regents of the University of California, Oakland, CA (US)

( * ) Notice: Subject to any disclaimer, the term of this patent is extended or adjusted under 35 U.S.C. 154(b) by 377 days.

(21) Appl. No.: 10/261,902

(22) Filed: Oct. 1, 2002

(65) Prior Publication Data

US 2004/0061099 A1    Apr. 1, 2004

(51) Int. Cl.
    G02B 5/30    (2006.01)
    G02B 1/02    (2006.01)
    H01S 3/115   (2006.01)
    H01S 3/16    (2006.01)

(52) U.S. Cl. .............. 252/584; 252/647; 372/21; 372/22; 117/13; 117/81; 117/944

(58) Field of Classification Search ............ 117/13, 117/81, 944; 252/584, 647; 372/21, 22; 371/21, 22
See application file for complete search history.

(56) References Cited

U.S. PATENT DOCUMENTS

| 5,030,851 A | 7/1991 | Unternahrer |
| 5,123,022 A | 6/1992 | Ebbers et al. |
| 6,083,319 A | 7/2000 | Aka et al. |
| 6,185,236 B1 * | 2/2001 | Eichenholz et al. ........ 372/41 |
| 6,301,275 B2 * | 10/2001 | Eichenholz et al. ........ 372/22 |
| 6,859,467 B2 * | 2/2005 | Adams et al. ............. 372/12 |

FOREIGN PATENT DOCUMENTS

WO    WO 96/26464    8/1996

OTHER PUBLICATIONS

Iwai, M. et al., "Crystal Growth and Optical Characterization of Rare-Earth (Re) Calcium Oxyborate ReCa$_4$O(BO$_3$)$_3$ (Re= Y or Gd) as New Nonlinear Optical Material," Department of Electrical Engineering, Faculty of Engineering, Osaka University, Dec. 4, 1996, pp. 276-279.
Adams, J.J., et al., "LaCa$_4$O(BO$_3$)$_3$(LaCOB)—A new nonlinear crystal from the GdCOB family," UCRL-JC-138484 Abs & Sum, University of California, Lawrence Livermore National Laboratory, Apr. 2000, 2 pages.
Aka, G, et al., "Linear- and nonlinear-optical properties of a new gadolinium calcium oxoborate crystal, Ca$_4$GdO(BO$_3$)$_3$," J. Opt. Soc. Am. B/vol. 14, No. 9/Sep. 1997, pp. 2238-2247.
Norrestam, R., et al., "Structural Investigations of New Calcium-Rare Earth (R) Oxyborates with the Composition Ca$_4$RO(BO$_3$)$_3$," Chem. Mater. 1992, 4, pp. 737-743.

* cited by examiner

Primary Examiner—Joseph D. Anthony
(74) Attorney, Agent, or Firm—Michael C. Staggs; John H. Lee

(57) ABSTRACT

A material for harmonic generation has been made by substitutional changes to the crystal LaCa$_4$ (BO$_3$)$_3$ also known as LaCOB in the form Re1$_x$Re2$_y$Re3$_z$Ca$_4$(BO$_3$)$_3$O where Re1 and Re2, (rare earth ion 1 and rare earth ion 2) are selected from the group consisting of Sc, Yttrium, La, Ce, Pr, Nd, Sm, Eu, Gd, Tb, Dy, Ho, Er, Tm, Yb, and Lu; Re3 is Lanthanum; and x+y+z=1.

2 Claims, 4 Drawing Sheets

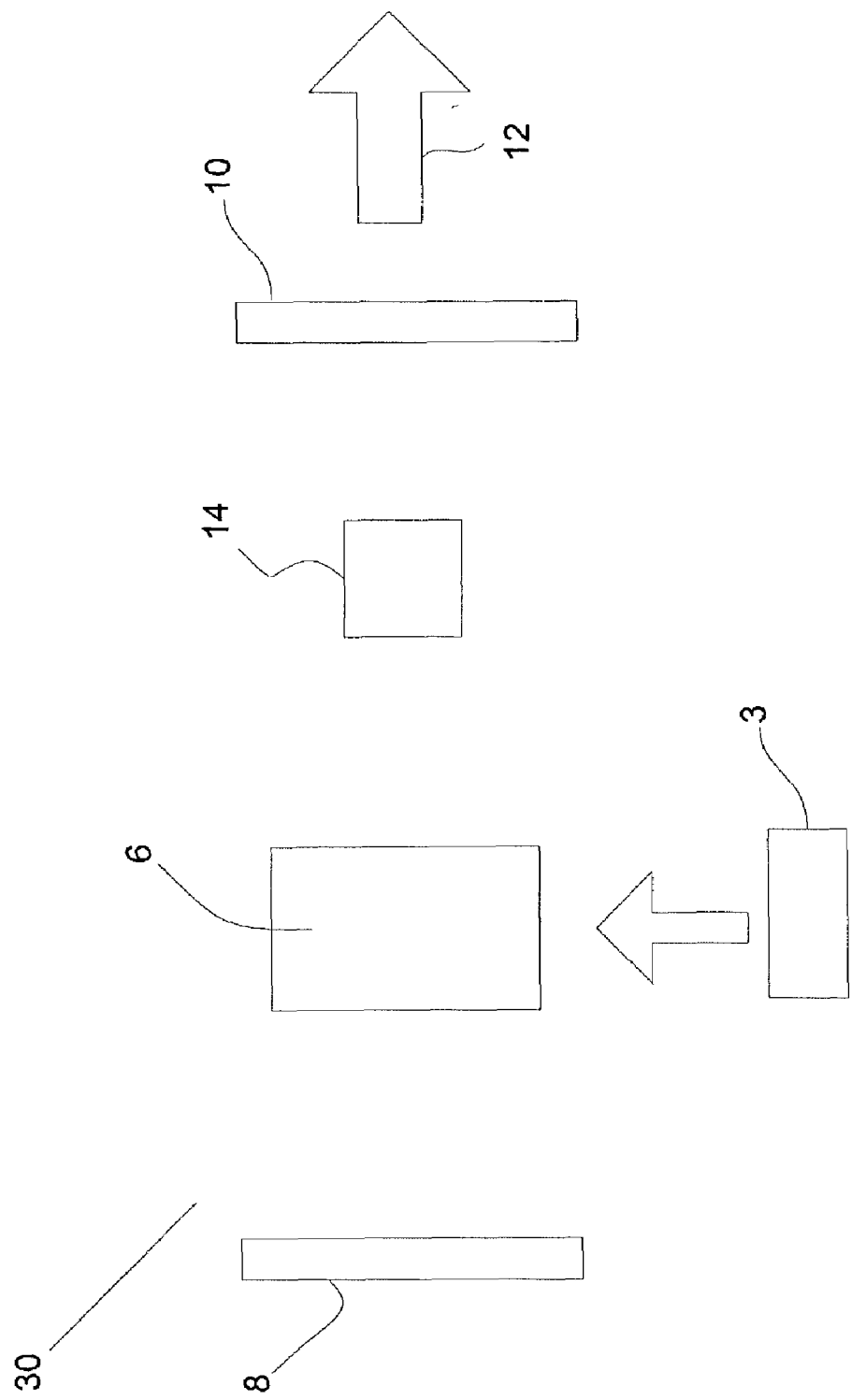

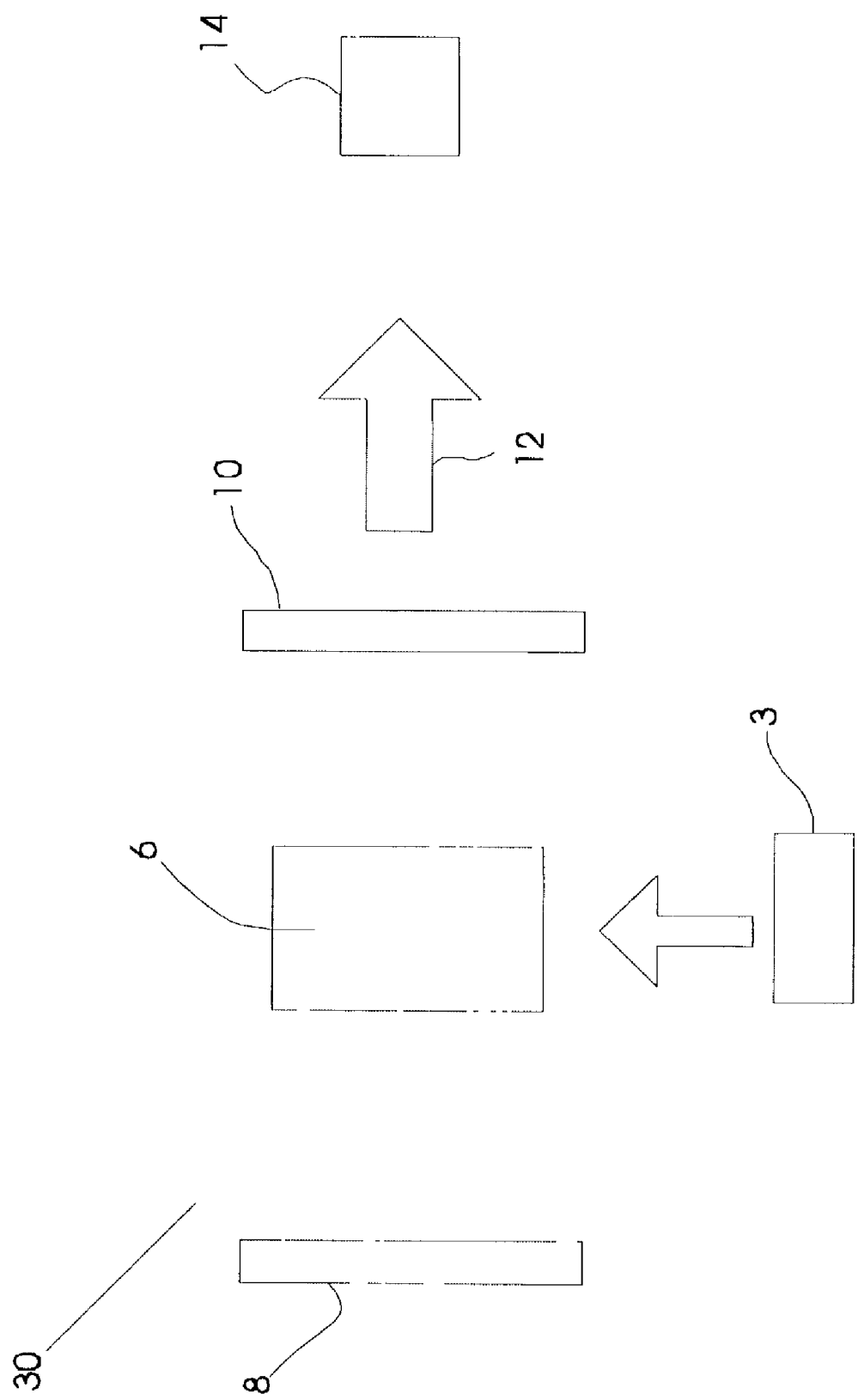

NONLINEAR OPTICAL CRYSTAL OPTIMIZED FOR YTTERBIUM LASER HOST WAVELENGTHS

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to solid-state laser materials, and specifically to noncritical phase matching laser materials capable of non-linear harmonic conversion of a specific wavelength.

2. State of Technology

Ytterbium doped laser hosts emit in the wavelength range between 970 nm and 1047 nm. Some examples of these crystals are Ytterbium doped strontium fluoro-apatite (i.e., Yb:SFAP), Ytterbium doped yttrium aluminum garnet (Yb:YAG), Ytterbium aluminum garnet (YbAG), Yb doped glass (Yb:glass), Yb doped potassium gadolinium tungstate (Yb:KGd(WO4)2), and Ytterbium doped fused silica (Yb:$SiO_2$). Each host has specific application and utility. Collectively, these lasers emit in the range of 970–1045 nm. For example, Yb:SFAP emits at several specific wavelengths, such as 1047 and 985 nm. As another example, Yb:YAG has a tunable laser emission between 1020 and 1045 nm, with a peak emission occurring at 1030 nm.

Frequency conversion of such lasers discussed above has been found to be useful for many applications. For example, frequency doubling of the 1029-nm emission of Yb:YAG leads to laser light at the wavelength of 514.5 nm. This specific wavelength is emitted by the Argon-ion laser and is a wavelength that has many beneficial and useful applications. For example, the 514.5-nm wavelength is useful in the biotechnology field for cell sorting of biological compounds. By utilizing frequency conversion, a solid-state frequency converted laser has the potential to replace the Ar-ion gas laser for this specific wavelength.

Background information on improved frequency mixing crystals for harmonic generation of laser beams is contained in U.S. Pat. No. 5,123,022 entitled "Frequency Mixing Crystal," to Ebbers et al., patented Jun. 16, 1992 including the following: "The improvement of said means of harmonic generation comprising a crystal having the chemical formula $X_2Y(NO_3)5.2nZ_2O$ wherein X is selected from the group consisting of Li, Na, K, Rb, Cs, and Tl; Y is selected from the group consisting of Sc, Y, La, Ce, Nd, Pr, Sm, Eu, Gd, Tb, Dy, Ho, Er, Tm, Yb, Lu, Al, and In; Z is selected from the group consisting of H and D; and n ranges from 0 to 4."

Background information on frequency mixing crystals by congruently melted compositions including a lanthanide is contained in international application No. WO 96/26464 entitled "Non-linear Crystals And Uses Thereof," to Gerard et al., patented Feb. 16, 1996, including the following: "The crystals are prepared by crystallizing a congruent melting composition of general formula: $M_2LnO(BO_3)_3$, wherein M is Ca or Ca partially substituted by Sr or Ba, and Ln is a lanthanide from the group which includes Y, Gd, La and Lu. Said crystals are useful as frequency doublers and mixers, as an optical parametric oscillator or, when partially substituted by $Nd^{3+}$, as a frequency doubling crystal.

Accordingly, a need exists to improve solid-state frequency materials for specific wavelengths. An ideal crystal is not difficult to grow, has a high nonlinear optical coefficient, has a high optical damage threshold, and birefringence and contains dispersion properties that allow for noncritical phasematching at specific wavelengths. The present invention involves such a crystal.

SUMMARY OF THE INVENTION

Accordingly, the present invention provides a frequency conversion crystal which is noncritically phasematched having a general chemical formula
Re1xRe2yRe3zCa$_4$(BO$_3$)$_3$O, wherein Re1 and Re2 are selected from the group consisting of Sc, Yttrium, La, Ce, Pr, Nd, Sm, Eu, Gd, Tb, Dy, Ho, Er, Tm, Yb, and Lu; Re3 is Lanthanum; and x+y+z=1.

Another aspect of the present invention provides a laser system having incorporated therein the frequency mixing crystal described herein.

Accordingly, the present invention provides an external or intracavity frequency conversion crystal with an increased birefringence to make such a crystal suitable for noncritical phasematching or substantially noncritical phasematching of wavelengths between about 970 and about 1047 nm, wavelengths emitted by Ytterbium doped laser hosts. Such a crystal is useful for medical and biological applications wherein a specific wavelength can be applied in a single shot or variable repetition rate pulsed format.

BRIEF DESCRIPTION OF THE DRAWINGS

The accompanying drawings, which are incorporated into and form a part of the disclosure, illustrate an embodiment of the invention and, together with the description, serve to explain the principles of the invention.

FIG. 3 is a basic schematic of an apparatus incorporating the crystal of the present invention in an intra-cavity configuration.

FIG. 4 is a basic schematic of an apparatus incorporating the crystal of the present invention in an external cavity configuration.

DETAILED DESCRIPTION OF THE INVENTION

Figure 1B:
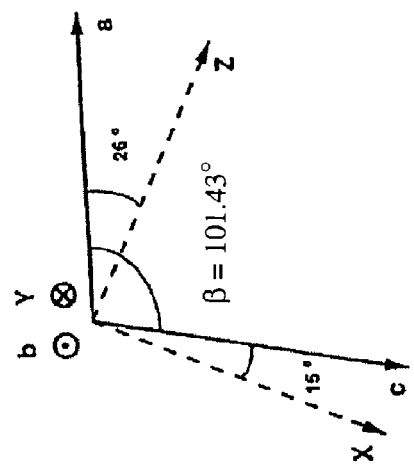
FIG. 1(b) illustrates the relative orientation of crystallographic (X, Y, Z) axes with regard to crystallographic axes (a, b, c) of a monoclinic structure.

Referring now to the following detailed information, and to incorporated materials; a detailed description of the invention, including specific embodiments, is presented. The detailed description serves to explain the principles of the invention.

Unless otherwise indicated, numbers expressing quantities of ingredients, constituents, reaction conditions and so forth used in the specification and claims are to be understood as being modified by the term "about." Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical value, however, inherently contain certain errors necessarily resulting from the standard deviation found in their respective testing measurements.

General Description

The present invention improves the performance of Ytterbium doped laser crystals that are intracavity, (i.e., the frequency conversion crystal is placed within a laser cavity), or externally frequency doubled, (i.e., the frequency conversion crystal is positioned external to a laser cavity). Specifically, the frequency conversion process is improved through the utilization of a frequency conversion crystal that is noncritically phasematched for the wavelength of interest. Noncritical phasematching occurs when the crystal is phasematched for propagation down one of the dielectric axis of a nonlinear optical crystal and allows for better conversion efficiency of lasers, particularly multimode lasers.

Accordingly, the present invention modifies properties of frequency conversion crystals such that these crystals can be made to noncritically phasematch or substantially noncritically phasematch wavelengths between about 970 nm and about 1042 nm, the wavelength range over which Ytterbium doped laser hosts have an emission output.

Specific Description

The present invention alters the birefringence and dispersion of lanthanum calcium oxyborate (LaCOB) to make a new crystal, which is capable of noncritical phasematching (NCPM). Phase matching in general occurs for certain crystallographic directions. If a light ray deviates from this phase-matched direction, the condition for phase matching no longer occurs. This places limitations on the allowable angular divergence of an input coherent source. In addition, because double refraction, i.e., birefringence, occurs in anisotropic materials such as in the present invention, the radiated wave and the polarization wave propagate in different optical angular directions within the crystal, also known as "walk-off," thereby reducing the interaction distance within the frequency converting crystal. Phase matching under these conditions is called critical phase matching (CPM). For certain crystallographic directions, a larger angular deviation is tolerated, resulting in a greater divergence from the phase-matched direction and no first-order walk-off occurs. This condition is termed non-critical phase matching (NCPM).

Accordingly, the optical birefringence and dispersion properties of a crystal, such as, but not limited to, LaCOB, can be predetermined by varying growth parameters so that phase matching occurs for crystallographic directions along which substantially NCPM is possible. In particular, the present invention varies specific growth parameters by the addition of other rare earth ions (and/or ions including yttrium and scandium) to the crystal growth melt during crystal growth in a controlled fashion to produce a crystal that is non-critically phase matched at a specific wavelength.

Attempts by others to grow crystals with good optical quality such as that of the present invention have been unsuccessful. Specifically, the present invention modifies the crystal $LaCa_4(BO_3)_3O$, also known as LaCOB by a substitutional change of the form $Re1xRe2yRe3zCa_4(BO_3)_3O$, where Re1 and Re2 (i.e., rare earth ion 1 and rare earth ion 2), can be selected from Sc, Y, La, Ce, Pr, Nd, Sm, Eu, Gd, Tb, Dy, Ho, Er, Tm, Yb, and Lu. Re3 is lanthanum (La), and a condition for variables x, y, and z is $x+y+z=1$.

Crystal Growth

The crystal of the present invention is prepared by melting the following oxides into a 3 inch high×3 inch diameter iridium crucible: $(Re1_2O_3)x$, $(Re2_2O_3)y$, $(Re3_2O_3)z$, $CaO_4$, $B_2O_3$, coupled with the condition $x+y+z=1$, in stoichiometric proportions. Between about 800 and about 1200 grams of the oxide and carbonate starting materials is used to grow the crystal. Boules of LaCOB are subsequently grown from a melt using the standard Czochralski pulling method. A seed of about 5 mm diameter is introduced at the top of the molten material and a crystal is grown by slowly pulling and rotating the crystal, while carefully controlling the temperature of the melt to maintain crystal diameter. A similar method for growing crystals of the present invention is disclosed in International Application No. WO 96/26464 entitled "Non-linear Crystals And Uses Thereof," by Gerard et al., which is fully incorporated herein by reference in its entirety. Although cracking is problematic, large crack free crystals are obtained by careful alignment of the seed crystal along a preferred growth direction (i.e., one of the dielectric axis) and by careful control of the cooling cycle. The material melts congruently with a growth rate of about 0.5 to about 1.5 mm/h. Exemplary growth sizes are from about 2.5 to about 3.0 centimeter in diameter with lengths from about 5.0 to about 15 centimeters. However, larger dimension crucibles capable of growing a crystal such as that of the present invention, with sufficient diameters and lengths, may be used to grow larger sized crystals if desired. The resultant crystal is clear, with good optical quality (i.e., a small number of optical defects numbering from about $\leq 10^2$ to about $10^3/cm^3$) and the mechanical properties of the present crystal allow polishing by conventional methods known in the art.

Crystal Properties

The crystal described herein, e.g., a modification of LaCOB, belongs to the calcium rare-earth oxyborate family that crystalizes in the monoclinic biaxial crystal system and as one embodiment, may be used with Ytterbium lasers.

Figure 1A:
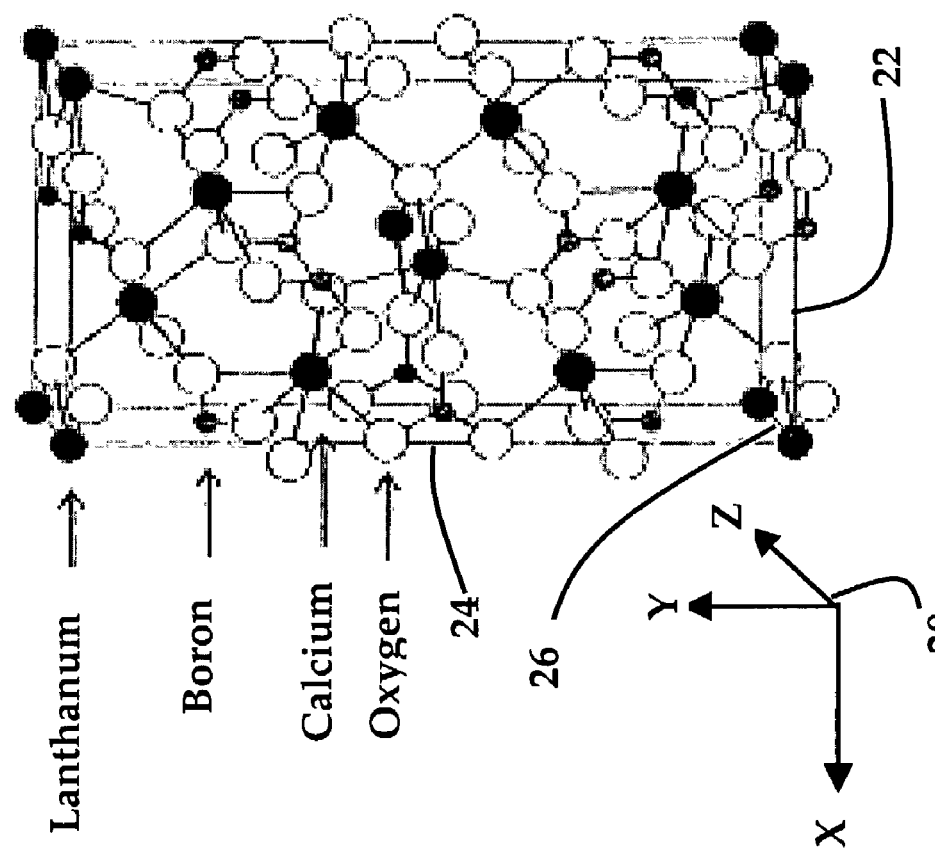
FIG. 1(a) illustrates the external morphology of a crystal produced by the present invention.

Referring to FIG. 1(a), the values of the unit cell constants (i.e., crystallographic axis) are a=8.095(7) angstroms 22, b=16.018(6) angstroms 24, c=3.558(8) angstroms 26, and β=101.43 degrees (not shown). The crystal belongs to the Cm space group and the number of the formula unit is Z=2. Monoclinic biaxial crystals such as that of the present invention display three different refractive indices, (i.e., $n_X < n_Y < n_Z$), along the crystallographic axis (X, Y, Z) 28 that do not correspond to crystallographic reference axis a 22, b, 24, and c 26 shown in FIG. 1(a).

FIG. 1(b) illustrates the relative orientation of (X, Y, Z) 28 with regard to the crystallographic axis a 22, b, 24, and c 26, as shown in FIG. 1(a). This orientation as determined by X-ray analysis gives b parallel to Y and normal to the plane in FIG. 1(b), a with respect to the Z axis equal to 26 degrees, c with respect to the X axis equal to 15 degrees, and β is the angle of the present invention's monoclinic unit cell. The crystal of the present invention is substantially transparent from about 320 to about 2600 nm and it is resistant to color center formation (i.e., a point lattice defect which produces optical absorption bands in an otherwise transparent crystal). In addition, the crystal is not sensitive to water, a property that allows for various optical anti-reflective coatings to be applied, such as but not limited to Sol-Gel, e-beam deposited and CVD coatings.

Crystal Structure Modification

The condition for type I doubling in the crystal of the present invention or its isomorphs in the alpha-gamma principle plane is shown in equation 1, $$\Delta K = 0 = [2n_y(\lambda_1)\omega_1/c] - [n_{xz}(\lambda_2)\omega_2/c],$$

where $\phi$ is the angle from the x dielectric axis in the x-z plane, $n_x$, ny, nz, are the principle refractive wavelength dependent indices and nxz is given by:

$$n_{xz} = n_x n_y / [n^2_x + (n^2_z - n^2_x)\sin^2(\phi)]^{0.5}. \quad (1a)$$

The angular sensitivity, $\beta_\phi$, is the change in $\Delta K$ with angle $\phi$, shown in equation 2.

$$\beta_\phi = d\Delta K/d_\phi = [(n_z-n_x)(n_z+n_x)\sin(2\phi)(n^x n_z)/[n^2_x + (n^2_z - n^2_x)\sin^2(\phi)]^{3/2}]$$

As seen from equation (2), the angular sensitivity $\beta_\phi$, for Type I doubling in the crystal of the present invention and its isomorphs, is proportional to the X-Z principle plane birefringence $(n_z-n_x)$. In turn, the figure of merit used for comparison against other materials is the threshold In turn, the figure of merit used for comparison against other materials is the threshold power $P_{th}$, proportional to $(\beta_\phi/d_{eff})^2$, where $\beta_\phi$ is the angular sensitivity, the rate of wavevector mismatch with respect to angular orientation, and $d_{eff}$ is the effective nonlinearity at that specific crystal orientation. The lower the threshold power, which is dependent on the $\alpha$-$\gamma$ principle birefringence plane, the better the material is for frequency conversion. For noncritical phasematching, the threshold power is zero. The present invention thus modifies the $\alpha$-$\gamma$ principle plane birefringence of crystal 20, shown in FIG. 1, and thus modifies the threshold power of the material by substitutional changes to crystal 20 by the addition of rare earth ions (and/or ions including yttrium and scandium) to the crystal growth melt during crystal growth.

Figure 2:
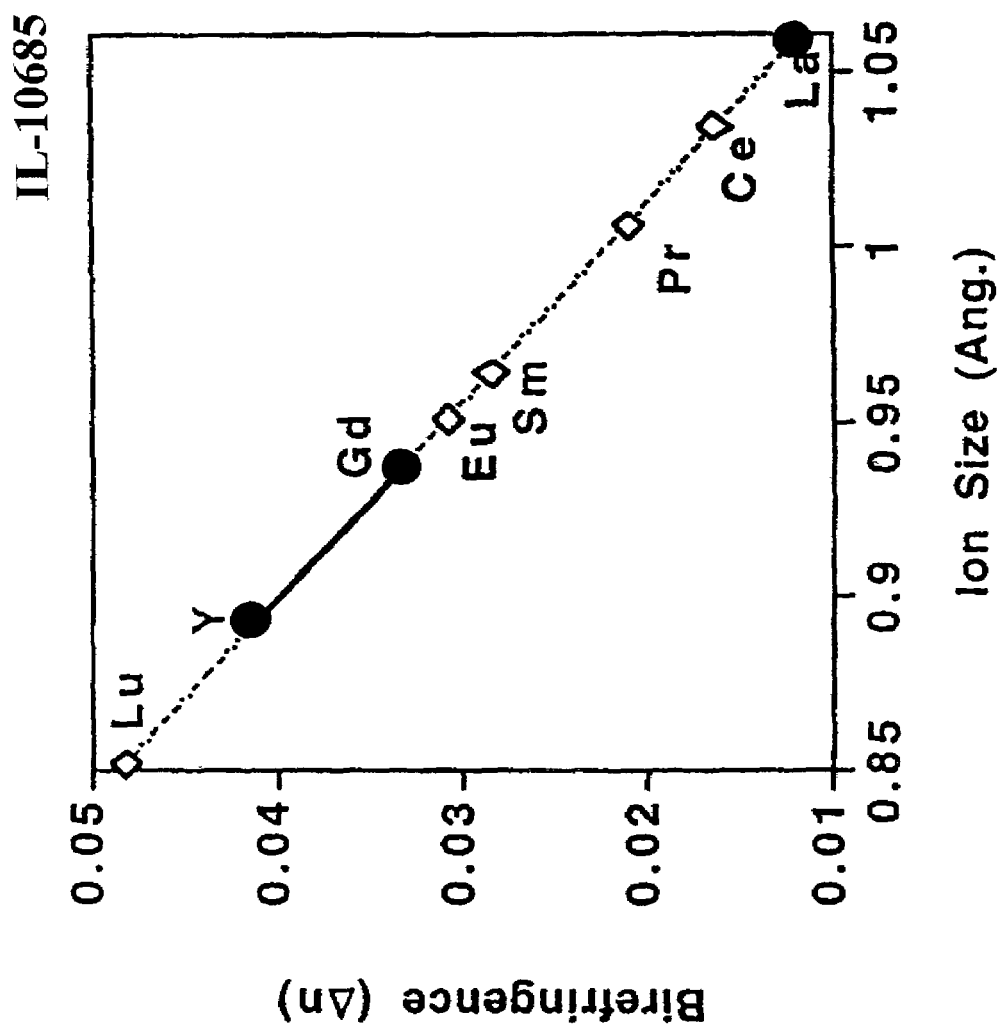
FIG. 2 shows a plot of birefringence versus rare earth ion size to illustrate the sensitivity of the birefringence of a crystal, such as in the present invention, to the size of a trivalent cation.

Turning to FIG. 2, a measured X-Z principle plane birefringence of GdCOB and YCOB and an extrapolated value for LaCOB is displayed relative to the ionic radius of the respective cation. FIG. 2 illustrates the sensitivity of the birefringence of a crystal, such as in the present invention, to the size of a trivalent cation (i.e., Y vs. Gd vs. La). Thus, crystal 20 shown in FIG. 1, is capable of being engineered to noncritically phasematch at an appropriate wavelength by incorporating a trivalent cation, such as La, into the into the growth composition during the growth process.

The present invention will be more fully understood by reference to the following two examples, which are intended to be illustrative of the present invention, but not limiting thereof.

EXAMPLE I $Gd_xLa_{1-x}Ca_4(BO_3)_3O$, with x in the range between about 0 and about 0.5, y=1-x, and z=0, is crystallized from a solution of $Gd_2O_3$, CaO, $B_2O_3$, and $La_2O_3$. The resulting crystal is useful as a high-efficiency frequency conversion crystal for wavelengths between about 1030 nm and about 1047 nm. Such a crystal allows noncritical phasematching by laser materials such as Yb:SFAP, Yb:TAG, Yb:SiO2, and Yb:Glass.

EXAMPLE II $Gd_xLa_{1-x}Ca_4(BO_3)_3O$, with x in the range between about 0.7 and about 1.0, y=1-x, and z=0, is crystallized from a solution of $Gd_2O_3$, CaO, $B_2O_3$, and $La_2O_3$.

The resulting crystal is useful as a high-efficiency frequency conversion crystal for wavelengths between about 970 nm and about 985 nm. Such a crystal allows noncritical phasematching by laser materials such as Yb:SFAP, Yb:YAG, Yb:SiO2, and Yb:Glass, when the peak laser emission is suppressed.

A laser apparatus generally designated by the reference numeral 30, into which the new material of the present invention may be incorporated, is illustrated schematically in FIG. 3. Laser apparatus 30, includes a laser gain medium 6, such as but not limited to Yb: laser host materials, for example Yb:SFAP, Yb:YAG, Yb:SiO2, and Yb:Glass, an excitation source 3, such as another laser, a laser diode or a laser diode array(s) to stimulate laser excitation of gain medium 6 either longitudinally or transversely. However, transverse pumping of the laser gain medium by other sources, such as LEDs or flashlamps may also be employed in conformance with the specifications of the present invention. A rear high reflector 8 (e.g., having a reflectivity greater than 98% for a predetermined wavelength), and an output coupler 10, (i.e., it allows extraction of the energy from a laser system) are arranged to form a resonant laser cavity (i.e., the laser apparatus) that includes gain medium 6. Such a resonant cavity of the present invention is capable of generating a beam 12 of coherent electromagnetic radiation having an emission wavelength between about 970 nm and about 1047 nm. A crystal 14 of the present invention can be adapted, (i.e., cut at the proper angles), and placed as an intracavity (i.e., within the resonant laser cavity) frequency conversion device to laser apparatus 30 to frequency double an emission wavelength. Such a frequency doubling method is capable of producing a wavelength between about 485 nm and about 523 nm, preferably 514 nm, by virtue of the non-linear frequency-conversion properties of crystal 14.

As an alternative embodiment, FIG. 4 shows laser apparatus 30 into which crystal 14 of the present invention may be incorporated as an extracavity device (i.e., external to the resonant laser cavity). Laser apparatus 30, includes a laser gain medium 6, such as but not limited to Yb: laser host materials, for example Yb:SFAP, Yb:YAG, Yb:SiO2, and Yb:Glass, and a similar excitation source 3 discussed herein before to stimulate laser excitation of gain medium 6. A rear high reflector 8 and an output coupler 10, for a predetermined wavelength may be configured to generate a beam 12 of coherent electromagnetic radiation having an emission wavelength between about 970 nm and about 1047 nm. The present invention in this embodiment is thus also capable of producing a wavelength between about 485 nm and about 523 nm, preferably 514 nm, by virtue of the non-linear frequency-conversion properties of crystal 14.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. A material for harmonic generation, comprising: a crystal having a general chemical formula $$Re1_x Re2_y Ca_4(BO_3)_3 O,$$

wherein Re1 is Gd and Re2 is Lanthanum; and x ranges from greater than 0 to about 0.7, y=1−x, and x+y=1; and wherein said Re1, Re2, are manipulated in a predetermined fashion during the growth process of said crystal so as to modify the principle birefringence plane of said crystal and enable noncritical phase-matching for harmonic generation.

2. The material of claim 1, wherein x ranges from greater than 0 to about 0.5.

* * * * *